(12) United States Patent
Kashima et al.

(10) Patent No.: US 8,038,810 B2
(45) Date of Patent: Oct. 18, 2011

(54) CLAD TEXTURED METAL SUBSTRATE FOR FORMING EPITAXIAL THIN FILM THEREON AND METHOD FOR MANUFACTURING THE SAME

(75) Inventors: Naoji Kashima, Aichi (JP); Shigeo Nagaya, Aichi (JP); Kunihiro Shima, Gunma (JP); Hirofumi Hoshino, Gunma (JP)

(73) Assignees: Chubu Electric Power Co., Ltd., Aichi (JP); Tanaka Kikinzoku Kogyo K.K., Tokyo (JP)

( * ) Notice: Subject to any disclaimer, the term of this patent is extended or adjusted under 35 U.S.C. 154(b) by 0 days.

(21) Appl. No.: 13/030,291

(22) Filed: Feb. 18, 2011

(65) Prior Publication Data

US 2011/0155050 A1 Jun. 30, 2011

Related U.S. Application Data

(62) Division of application No. 12/101,348, filed on Apr. 11, 2008, now Pat. No. 7,927,715.

(30) Foreign Application Priority Data

Apr. 17, 2007 (JP) .............................. P2007-108606

(51) Int. Cl.
*C22F 1/08* (2006.01)
(52) U.S. Cl. ............................ 148/536; 148/518; 117/9

(58) Field of Classification Search .................... None
See application file for complete search history.

(56) References Cited

U.S. PATENT DOCUMENTS

2009/0038714 A1 2/2009 Goyal

OTHER PUBLICATIONS

Varanasi, Chakrapani V., et al. "Biaxially Textured Copper and Copper-Iron Alloy Substrates for Use in $YBa_2Cu_3O_{7-x}$ Coated Conductors." *Superconductor Science and Technology*, ISSN-0953-2048, 2006, vol. 19, p. 85-95.
Yu et al., "LZO Covered Cu-based Substrates". Journal of Alloys and Compounds, vol. 460, No. 1-2, Jun. 2, 2007, pp. 519-523.
Miyoshi et al. "Development of Textured Substrates With High Strength and Weak Magnetism", Physica C. vol. 445-448, Oct. 1, 2006, pp. 614-619.

*Primary Examiner* — Aaron Austin
(74) *Attorney, Agent, or Firm* — Roberts & Roberts, LLP

(57) ABSTRACT

A method for manufacturing a oriented substrate for forming an epitaxial thin film thereon, having a more excellent orientation than that of a conventional one and a high strength, and a method for manufacturing the same. The clad textured metal substrate includes a metallic layer and a copper layer bonded to at least one face of the above described metallic layer, wherein the above described copper layer has a $\{100\}<001>$ cube texture in which a deviating angle $\Delta\phi$ of crystal axes satisfies $\Delta\phi \leq 6$ degree. The substrate has an intermediate layer on the surface of the copper layer, to form the epitaxial thin film thereon.

20 Claims, 4 Drawing Sheets

CLAD TEXTURED METAL SUBSTRATE FOR FORMING EPITAXIAL THIN FILM THEREON AND METHOD FOR MANUFACTURING THE SAME

CROSS REFERENCE TO RELATED APPLICATION

This application is a division of U.S. patent application Ser. No. 12/101,348, filed Apr. 11, 2008 now U.S. Pat. No. 7,927,715, which is incorporated herein by reference. This application claims the benefit of priority from Japanese Patent Application No. P2007-108606 filed Apr. 17, 2007.

BACKGROUND OF THE INVENTION

1. Field of the Invention

The present invention relates to a textured metal substrate for forming an epitaxial thin film thereon and a method for manufacturing the same, and specifically relates to a textured metal substrate which is provided with a copper layer having a predetermined orientational structure, can make the thin film of high quality epitaxially grown thereon, and has a reliable strength, and a method for manufacturing the same.

2. Description of the Related Art

In recent years, a thin film produced while paying attention to characteristics of an epitaxial crystal structure is used in various fields. For instance, a superconducting thin film (formed of oxide superconducting material) having the epitaxial crystal structure is used in a superconducting conductor, a superconducting shield and the like, which are applied to various electric power units. However, the superconducting thin film having such an epitaxial crystal structure is inferior in workability, and has a defect of being hardly molded into a desired shape. For this reason, a superconductor of a shape suitable for a field of application is conventionally obtained by appropriately employing a necessary substrate for applying a superconducting material thereon, and epitaxially growing the superconducting film on the surface.

As such a substrate for forming an epitaxial thin film thereon, a clad textured metal substrate is used which has a {100}<001> cube texture employs and is made from copper or a copper alloy (for instance, "Biaxially textured copper and copper-iron alloy substrates for use in YBa[2]Cu[3]O[7][-][x]" (Superconductor science and technology IS SN0953-2048, 2006, vol. 19, p. 85-95)). Characteristics of a superconducting material are affected by the orientation of composing crystals, and the crystal structure formed through epitaxial growth is affected by the orientation of the surface of the substrate. A substrate having excellent orientation can be easily obtained by appropriately adding working and heat treatment (recrystallization) to a copper-based metallic material.

However, a textured metal substrate for forming an epitaxial thin film made from the above described copper-based material has several problems. Particularly, a problem of the strength is pointed out. This is because the crystal structure of the textured metal substrate is formed basically by recrystallization, and a metal having a recrystallized structure cannot help decreasing the strength, which is general characteristics of a metallic material. It is hard to handle the substrate having poor strength when forming an epitaxial thin film thereon, because the substrate may be damaged.

In addition, a conventional copper-based substrate has not had a satisfactory orientational structure even though having it. The orientation of a substrate greatly affects the characteristics of the epitaxial thin film formed thereon, so that the substrate is required to have an orientation as adequate as possible.

The present invention has been accomplished based on the above described background, and is directed at providing the oriented substrate for forming an epitaxial thin film thereon which has a better orientation than that of a conventional one and a high strength, and a method for manufacturing the same.

SUMMARY OF THE INVENTION

The present inventors made an extensive investigation for solving the above described problems, and determined that the solving method is to employ a clad substrate having a two-layer structure to improve the strength, which comprises a copper layer of a substrate for growing an epitaxial thin film thereon and a metallic layer for supporting the copper layer.

Specifically, the present invention provides a clad textured metal substrate for forming the epitaxial thin film thereon, which includes a metallic layer and a copper layer bonded to at least one face of the metallic layer, wherein the copper layer has a {100}<001> cube texture in which a deviating angle $\Delta\phi$ of crystal axes satisfies $\Delta\phi \leq 6$ degrees.

A crystal structure of the copper layer according to the present invention is the {100}<001> cube texture, and the deviating angle $\Delta\phi$ of crystal axes, which is an index of the orientation (orientation degree), is $\Delta\phi \leq 6$ degrees. In the present invention, metallic crystals composing the copper layer are biaxially oriented. Specifically, the face {100} is approximately parallel to the surface of the substrate, an axis <001> is oriented approximately parallel to a longitudinal direction of the substrate surface, and the deviating angle is 6 degrees or less. This is because the deviating angle $\Delta\phi$ needs to be controlled to 6 degrees or less, in order to form an epitaxial thin film having higher quality. The $\Delta\phi$ is preferably as small as possible and is ideally 0 degree, that is to say, crystals have no deviation of crystal axes among them. However, when considering production possibility, the $\Delta\phi$ is preferably 0.1 degrees or more.

An orientation substrate for forming an epitaxial thin film according to the present invention has an approximately flat bonded interface of a copper layer with a metallic layer, and the waviness is preferably in a range of 1 to 500 nm. When the unevenness of the bonded interface is large, the copper layer shall have ununiform thickness. Particularly when the copper layer is thin, even the slight unevenness makes the thickness of the copper layer ununiform, and consequently gives a harmful influence on an epitaxial thin film to be grown on the copper layer. Accordingly, the bonded interface between the metallic layer and the copper layer is preferably in a state of being sufficiently flattened and being free from such an oxide coating and an adsorbate as to obstruct the flattening of the interface. In the present invention, the waviness means the unevenness which is observed in a cross section of the bonded interface, and the dimension of the waviness means an amplitude between the top end and the bottom end of adjacent waves. A metal substrate according to the present invention has a mean value of waviness preferably in a range of 1 to 500 nm when measured through observation (SEM or TEM) for the cross section.

The copper layer also has a surface roughness Ra preferably of 10 nm or less on its surface. This is because the surface roughness of the surface of the copper layer can affect characteristics of an epitaxial thin film which will grow on the surface. The lower limit of the surface roughness is preferably as small as possible, but is preferably 0.1 nm or more when considering a working limit and efficiency.

A metal substrate according to the present invention more preferably has an intermediate layer on the surface of the copper layer, on which an epitaxial thin film will be formed. The intermediate layer is a layer which shall exist between the epitaxial thin film and the substrate (copper layer) when the epitaxial thin film will be formed. The reason why the intermediate layer is preferably employed is based on the characteristics of copper composing the substrate. Specifically, when an oxide such as a superconducting film is formed on the substrate, oxygen in the superconducting film occasionally diffuses into the substrate though depending on a temperature during film formation, and the oxygen forms an oxide (copper oxide) on the surface of the copper layer of the substrate. The copper oxide has poor crystal conformability with copper and a metallic layer which supports the copper layer, and accordingly tends to exfoliate the superconducting film together with the copper oxide when the copper oxide is formed on the copper layer. For this reason, it is preferable to form the intermediate layer on the copper layer as a barrier layer for preventing oxygen from diffusing from the superconducting film to the substrate (copper layer).

The intermediate layer is preferably provided with at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium and platinum. The reason why these metals or compounds are preferable is because they are materials that can be epitaxially grown on copper, and provide an effect of preventing the copper surface from being oxidized. In the compounds for forming the intermediate layer, cerium oxide is preferable among the rare-earth oxides, and Yttria-stabilized zirconia (YSZ) which is stabilized into a cubic crystal by containing added Yttria is preferable among zirconium oxides. The intermediate layer preferably has the thickness in a range of 10 nm to 10 μm. The intermediate layer is formed while keeping an orientational structure same as in the copper layer to be an underlayer. When the intermediate layer is formed excessively thick, a thin film to be formed afterwards is hard to be epitaxially grown and the quality is adversely affected. The intermediate layer preferably has a thickness in a range of 50 nm to 5 μm, and more preferably in a range of 50 nm to 1 μm.

The intermediate layer is provided with at least one layer among layers made from the above described materials, and accordingly may have a single layer or a multilayer structure. When the intermediate layer employs a multilayer structure, the bottom layer formed in contact with the copper layer is preferably made from nickel. The nickel layer is preferably formed by using a plating method. This is because the nickel precipitated by plating has adequate crystallinity and shows adequate orientation when combined with the orientation of the copper layer to be the underlayer.

On the other hand, a metallic layer which supports a copper layer and composes a substrate is preferably made from any one of stainless steel and a nickel alloy (hastelloy alloy, inconel alloy, incoloy alloy, monel alloy and the like). The above described materials are preferred in order to secure the strength of the copper layer from the viewpoint that the metallic layer needs to have adequate strength and flexibility even having a thin sheet shape or a tape shape.

The thickness of the oriented substrate (total thickness of copper layer and metallic layer) according to the present invention is not particularly limited, but can be set according to the thickness of a superconducting material to be produced, and can cope with various shapes such as a sheet shape, a thin sheet shape and a tape shape (1 mm or less). In addition, the thickness of the copper layer and the metallic layer are not limited in particular, but the thickness of the metallic layer is preferably 40% or more of that of the whole oriented substrate in order to secure the strength. The metallic layer preferably has a thickness of 10 μm or more.

When manufacturing a textured metal substrate for forming an epitaxial thin film according to the present invention, it is necessary to make an orientation of a copper layer sufficient and make the copper layer strongly bonded with a metallic layer. As a manufacturing method for satisfying such a request, a cladding method is considered which is a method of pressure-welding a crystal-oriented copper sheet with a metal sheet which will be a metallic layer, but the method cannot achieve the original object of manufacturing an oriented substrate, because of disordering the crystal orientation of the copper layer by a pressure in pressure welding. On the other hand, a method of firstly cladding the copper sheet with the metal sheet and then heat-treating the clad to make the crystals of the copper layer oriented is considered as well, but the method cannot achieve the object of high strength, because the metal sheet is softened by heat treatment in the orienting treatment and loses the function as a reinforcing member.

The present inventors found that a method of subjecting a copper sheet which will be a copper layer to orienting treatment at first and bonding a metal sheet which will be a metallic layer with the oriented copper sheet without or through the application of low pressure by using a surface activated bonding process is suitable for a method of manufacturing an oriented substrate according to the present invention. The method can strongly bond the metal sheet with the copper layer while keeping the orientation of the copper layer. The manufacturing method includes the following steps:

(a) an orienting heat treatment step of cold-working a copper sheet at a working rate of 95% or more, and heat-treating the copper sheet obtained through the cold working in a non-oxidative atmosphere to make at least the surface part a {100}<001> cube texture having a deviating angle $\Delta\phi$ of crystal axes satisfying $\Delta\phi \leqq 6$ degrees;

(b) a step of preparing a metal sheet; and (c) a surface activated bonding step of dry-etching the surfaces to be bonded of the copper sheet obtained by the orienting heat treatment step and the metal sheet in a non-oxidation atmosphere to remove the oxide and adsorbate on the surfaces to be bonded, and bonding the copper sheet with the metal sheet without or through the application of pressure.

The method according to the present invention includes the step of firstly cold-working and heat-treating the copper sheet to orient the structure, as in the above described step (a). The working rate for the copper sheet is 95% or more and is preferably 97% or more. When the working rate is less than 95%, an adequate orientational structure cannot be obtained. The copper sheet has preferably high purity, and has preferably a purity of 99.9% or more. This is because when the purity is low, an adequately oriented crystal structure cannot be obtained.

It is preferable to set a treatment temperature of orienting heat treatment (recrystallization treatment) after cold working to 200° C. or higher but a melting point of copper or lower. When the heat treatment temperature is lower than 200° C., the copper layer may not obtain adequate orientational structure. The heat treatment temperature is set at the melting point or lower, but is preferably 800° C. or lower, and is more preferably in a range of 300 to 700° C. A heat treatment period of time is preferably in a range of 1 to 30 minutes. When the heat treatment temperature is higher than 700° C. or the heat treatment period of time is longer than 30 minutes, the groove in a crystal grain boundary may be deepened and a polishing operation may be necessary after orienting treatment in order to remove the groove.

After the copper sheet has been subjected to orienting heat treatment in this way, a metal sheet to be bonded with the copper sheet is prepared (the above described step (b)). A commercial sheet or a tape material may be directly used as the metal sheet or may be subjected to pretreatment for working such as rolling before being used as the metal sheet.

In the present invention, a surface activated bonding process is employed as a method of bonding an oriented copper layer with a metallic layer (the above described step (c)). The surface activated bonding process is a method of, as described above, removing an oxide and adsorbate on the faces (surfaces) to be bonded by dry etching, and bonding the faces immediately after having exposed a base material (pure metal) to the atmosphere. The bonding method is based on metal atomic force, which is generated between atoms (molecules) in a state of having removed all impurities such as oxides from the surfaces.

Either of etching methods using an ion beam or atom beam of Ar or the like, or using plasma can be specifically used as a method of dry etching for activating the surfaces. It is necessary to carry out the dry etching process in a non-oxidation atmosphere, and it is preferable to carry out the dry etching process particularly in a vacuum.

The surface activated bonding process can bond the materials to be bonded without the application of pressure, and can bond them as well only by overlapping them. However, it is acceptable to pressurize both materials, in order to align them or bond them more strongly. However, the pressurizing force is as low as not to deform the shape of the materials, and is preferably in a range of 0.01 to 300 MPa. The surface activated bonding process can bond the material at room temperature. Accordingly, it is not necessary to heat the working atmosphere in a bonding operation. When the materials are being dry-etched, the temperature on the surface of the materials may rise, but the temperature rise is different from heating for the bonding operation. It is preferable to make the atmosphere non-oxidative when the materials are bonded, as well.

Thus, the clad substrate formed of a copper layer having an orientational structure and a metallic layer can be manufactured by the above described steps.

In addition, a clad substrate according to the present invention is preferably provided with an intermediate layer on a copper layer. The intermediate layer can be produced by various processes for producing a thin film such a PLD (pulse laser vapor deposition) method, a CVD (chemical vapor deposition) method, a sputtering method, a vacuum deposition method, an ion plating method, an ion beam vapor deposition method, a spin coating method, an MBE (molecular beam epitaxy) method and a plating method. The intermediate layer is preferably formed after the copper layer and the metallic layer have been cladded.

Furthermore, in the present invention, a surface roughness Ra of the surface (surface on which epitaxial film will be grown) of a copper layer is preferably 10 nm or less, so that it is preferable to appropriately treat the surface of the copper layer. The surface roughness is preferably adjusted by polishing the surface with any method of an electrolytic polishing method, a mechanical polishing method, a chemical polishing method including a chemical polishing method, a chemo-mechanical polishing method and the like, and an electro-composite polishing method including an electro-abrasive polishing method, an electromechanical polishing method and the like. At least the surface of the copper sheet after having been subjected to orienting treatment is preferably polished. Alternatively, it is acceptable to polish the copper sheet before and after finish rolling prior to the orienting treatment, and polish the copper sheet again after the orienting treatment or a cladding operation.

The clad substrate according to the present invention preferably has a small waviness of the interface between the copper layer and the metallic layer. The waviness can be controlled by flattening a reduction roll to be used when the copper sheet and the metal sheet are rolled. A surface activated bonding process can bond the sheets without the application of pressure or through the application of low pressure, accordingly can keep surfaces to be bonded flat by previously flattening the surfaces before bonding them. In this regard, the sheets are preferably finish-rolled in a rolling process, by using a lapping roll made from cemented carbide which is hard to produce waviness. Alternatively, the sheets may be polished by using the above described polishing method.

As discussed above, a substrate for forming an epitaxial thin film thereon according to the present invention has a metallic layer cladded on a copper layer having an orientational structure, and accordingly has a higher strength than a conventional substrate. A manufacturing method according to the present invention can stably form a thin film of high quality without damaging the substrate, in a process of forming the epitaxial thin film such as a superconducting film onto the substrate.

DETAILED DESCRIPTION OF THE PREFERRED EMBODIMENTS

Preferred embodiments according to the present invention will now be described below with reference to the drawings.

Exemplary embodiment 1: A tape-shaped copper sheet with a thickness of 3,000 μm was prepared and was cold-rolled (at room temperature) with a reduction roll at a working rate set at 95%. At this time, the copper sheet was electrolytically polished and then finish-rolled by using a lapping roll made from cemented carbide. The copper sheet was electrolytically polished in a sulfuric-acid-based electrolytic solution at a current density of 35 A/dm$^2$ for 30 seconds. After rolled, the copper sheet was heat-treated and the crystal structure was oriented. In the heat treatment step, the copper sheet was heated in an atmosphere containing 95% of nitrogen gas and 5% of hydrogen gas at 700° C. for 30 minutes.

Next, a metal sheet to be cladded with the above described copper sheet was prepared. The prepared metal sheet was a stainless steel sheet (SUS304) which had been rolled into a tape shape with a thickness of 100 μM beforehand.

Figure 1:
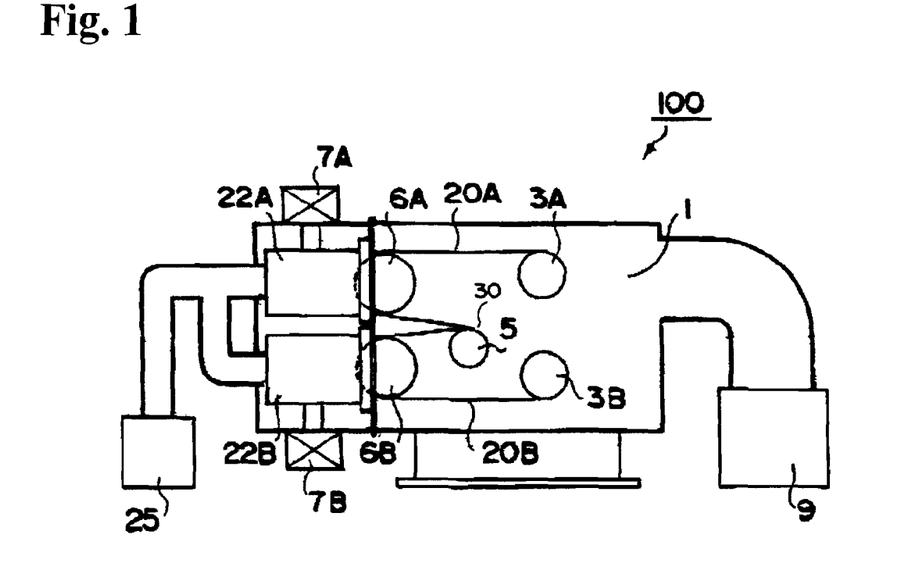
FIG. 1 is a schematic view of a surface activated bonding apparatus in an embodiment.

Then, the copper sheet and the metal sheet were cladded by a surface activated bonding method with the use of a surface activated bonding apparatus 100 which will be described below.

FIG. 1 illustrates a schematic view of a surface activated bonding apparatus 100 used in the present embodiment. The surface activated bonding apparatus 100 is a vacuum apparatus, and is partitioned into etching chambers 22A, 22B and a vacuum tank 1. The vacuum tank 1 and the etching chambers 22A and 22B are also connected to exhaust pump units 9 and 25 respectively. Parts of electrode rolls 6A and 6B project into the etching chambers 22A and 22B respectively, and are vacuum-sealed there. Thus, the electrode rolls 6A and 6B are placed in the vacuum tank. Electrodes (not shown) for passing an electric current to the electrode rolls 6A and 6B are provided on outer walls of the etching chambers 22A and 22B. Power supply units 7A and 7B are installed so as to apply high voltage between respective electrodes. In the vacuum chamber 1, wind-off reels 3A and 3B are installed so as to wind off a copper sheet 20A and a metal sheet 20B which are to be dry-etched. In addition, a wind-up roll 5 is installed so as to wind up the copper sheet 20A and the metal sheet 20B which were dry-etched and bonded with each other.

The surface activated bonding apparatus 100 makes the wind-off reels 3A and 3B wind off the copper sheet 20A and the metal sheet 20B, hang the sheets on the peripheral surfaces of electrode rolls 6A and 6B respectively, applies high voltage to the sheets in etching chambers 22A and 22B, thereby makes an inert gas such as argon gas sealed in the room generate glow discharge, and makes the molecules of the inert gas sputter the surfaces of the copper sheet 20A and the metal sheet 20 due to high voltage to etch the surfaces. Thus, the bonding apparatus removes an oxide and adsorbate on the surfaces to make the surfaces clean and flat. Then, the activated copper sheet 20A and metal sheet 20B are bonded along with the operation of the wind-up roll 5, and a clad textured metal substrate 30 is manufactured. In the present embodiment, conditions of dry etching were set as described below.

Etching method: Ar beam etching
Vacuum degree: $10^{-5}$ Pa
(under argon gas atmosphere in vacuum tank and etching chamber)
Applied voltage: 2 kV
Etching period of time: 5 minutes
Pressurizing force in cladding operation: 2 MPa Thus manufactured clad textured metal substrate was collected, and the surface of the copper layer was electrolytically polished in a similar condition to the above described one. Then, the state of orientation of the copper layer and the bonded interface were confirmed.

Exemplary embodiment 2: a clad textured metal substrate was manufactured by heat-treating the same copper sheet as in Exemplary embodiment 1 at a changed temperature of 200° C. so as to orient the structure of the surface, and on the same conditions as in Exemplary embodiment 1 except the heat treatment temperature.

Comparative example: a clad textured metal substrate was manufactured by heat-treating the copper sheet at a temperature of 100° C. in order to investigate the influence of orienting treatment temperature, and on the same conditions as in Exemplary embodiment 1 except the heat treatment temperature.

Figure 2:
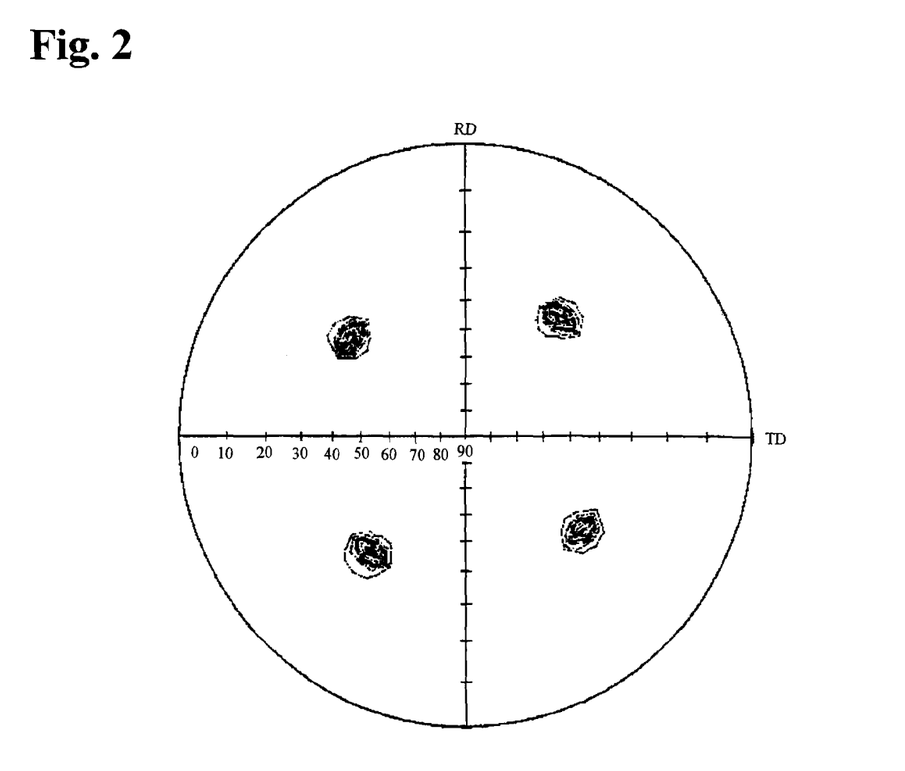
FIG. 2 is an X-ray pole figure of a copper layer surface of a clad textured metal substrate according to a first embodiment.
Figure 3:
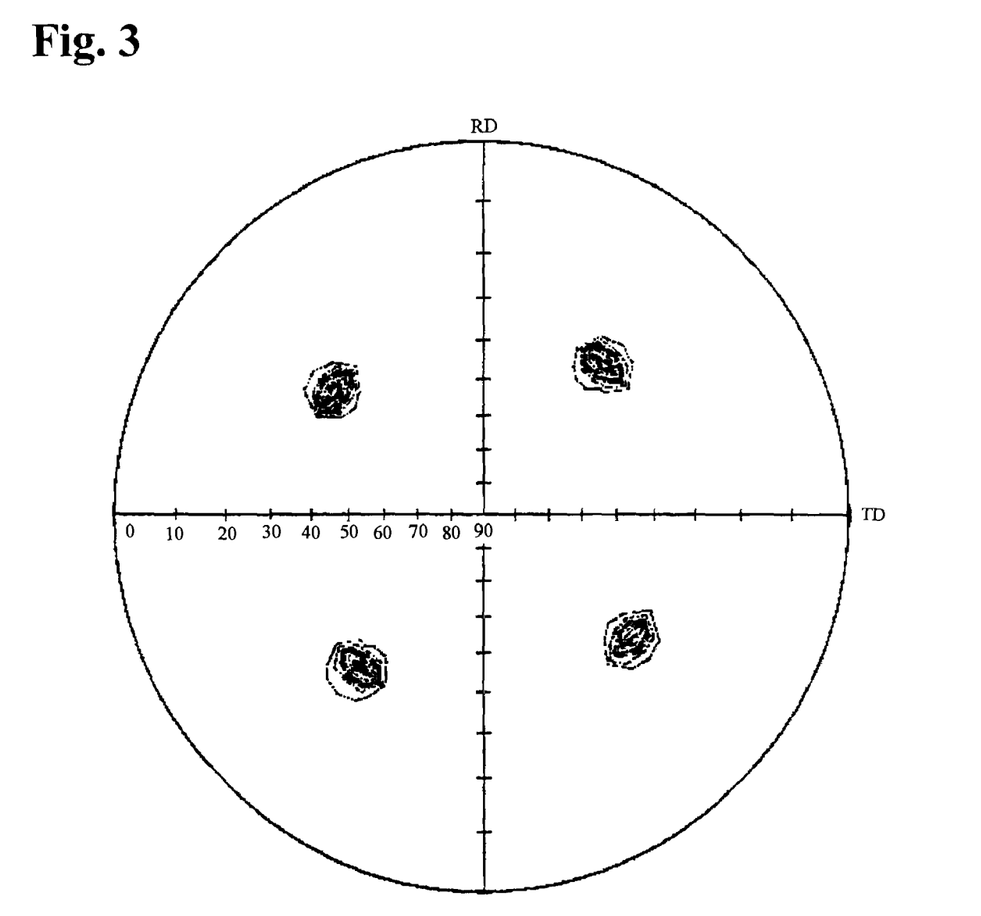
FIG. 3 is an X-ray pole figure of a copper layer surface of a clad textured metal substrate according to a second embodiment.
Figure 4:
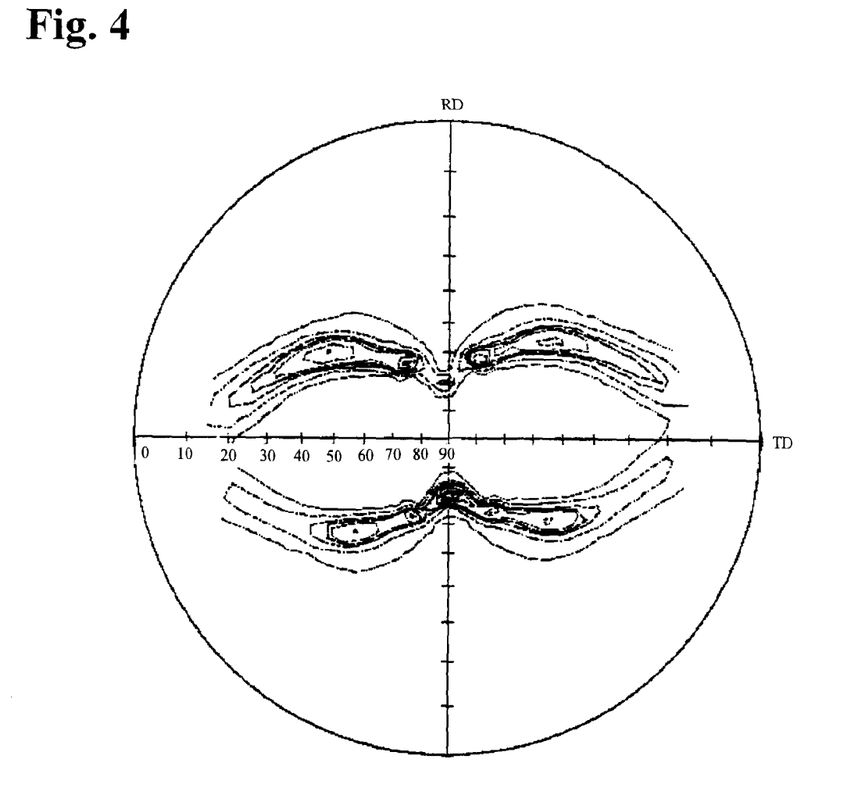
FIG. 4 is an X-ray pole figure of a copper layer surface of a clad textured metal substrate according to Comparative example 1.

Evaluation on orientation; the orientation of a copper layer was examined on a clad textured metal substrate manufactured according to the above process. The orientation was examined by using an X-ray pole figure analysis (XPFA). FIG. 2 to FIG. 4 illustrate an X-ray pole figure of a (111) face in each sample. As is understood from the FIGS., the copper layer of a clad textured metal substrate for forming an epitaxial thin film thereon produced in Exemplary embodiment 1 (FIG. 2) clearly shows four independent peaks. From the result, it was confirmed that the copper layer had adequate orientation. In addition, a deviating angle Δφ was determined from the full width at half maximum (FWHM) of a peak obtained from a φ scanning result. As a result, the deviating angles Δφ of the copper layer of the above described sample were 4.5 degrees and 5.0 degrees. On the other hand, Comparative example 1 (FIG. 4) does not show such a clear peak as described above. Thus, it was confirmed that Comparative example 1 did not have satisfactory orientation.

Figure 5:
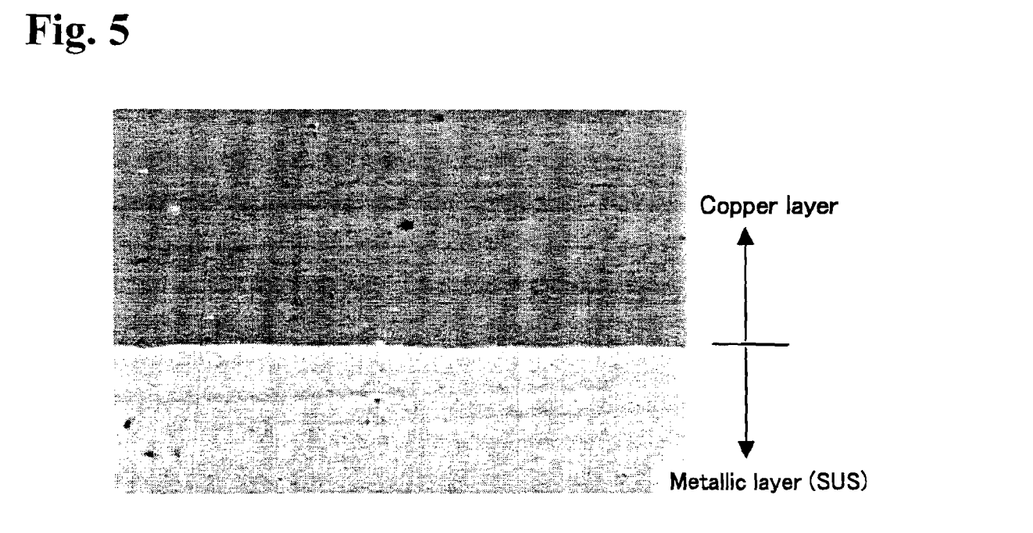
FIG. 5 is a sectional photograph showing a bonded interface between a copper layer and a metallic layer of a clad textured metal substrate according to a first embodiment.

Evaluation of bonded interface: FIG. 5 is a photograph showing the bonded interface of a clad textured metal substrate for forming an epitaxial thin film thereon according to Exemplary embodiment 1 (magnification of 5,000 times). As is understood from FIG. 5, the interface between a copper layer and a metallic layer was approximately flat. The waviness was 300 nm or less.

Exemplary embodiment 3: here, a clad textured metal substrate having an intermediate layer was manufactured and the usability was examined. At first, a clad substrate manufactured in Exemplary embodiment 1 was plated with nickel. At this time, a nickel layer was formed into the thickness of 1 μm (Sample 1) on plating conditions of a current density in a range of 1 to 10 A/dm² and a bath temperature in a range of 40 to 60° C. In addition, substrates having an intermediate layer made from various materials described below on the nickel layer were prepared.

TABLE 1

| | Substrate structure | Thickness of intermediate layer (total) |
|---|---|---|
| Sample 1 | Cu/Ni | 1 μm |
| Sample 2 | Cu/Ni/YSZ/CeO$_2$ | 1.5 μm |
| Sample 3 | Cu/Ni/MgO/CeO$_2$ | 1.3 μm |
| Sample 4 | Cu/Ni/CeO$_2$/YSZ/CeO$_2$ | 1.8 μm |
| Sample 5 | Cu/Ni/STO/Y$_2$O$_3$ | 1.6 μm |

Cu is a metallic layer of an underlayer.

The intermediate layer (YSZ, cerium oxide or the like) was formed on nickel by using a PLD method. A target having the same composition as in the objective thin film was used. A substrate temperature was set at 750 to 800° C., a gas pressure at 5 to 10 Pa and a laser frequency at 5 to 10 Hz. The conditions were adjusted according to each material.

Then, a superconducting thin film (YBCO) was formed on the produced clad substrate provided with the intermediate layer. The YBCO film was formed also by using the PLD method. A YBCO target was used. A substrate temperature was set at 780° C., a gas pressure at 35 Pa and a laser frequency at 2 Hz. When the YBCO film was formed, it was examined whether the thin film exfoliated or not. The result is shown in Table 2.

TABLE 2

| | Substrate structure | Presence of exfoliation |
|---|---|---|
| Sample 1 | Cu/Ni | No exfoliation*1 |
| Sample 2 | Cu/Ni/YSZ/CeO$_2$ | No exfoliation |
| Sample 3 | Cu/Ni/MgO/CeO$_2$ | No exfoliation |
| Sample 4 | Cu/Ni/CeO$_2$/YSZ/CeO$_2$ | No exfoliation |
| Sample 5 | Cu/Ni/STO/Y$_2$O$_3$ | No exfoliation |
| Comparative sample | Cu (no intermediate layer) | Exfoliated |

Cu is a metallic layer of an underlayer.
*1: Exfoliation was not seen but the substrate was blackened.

Figure 6:
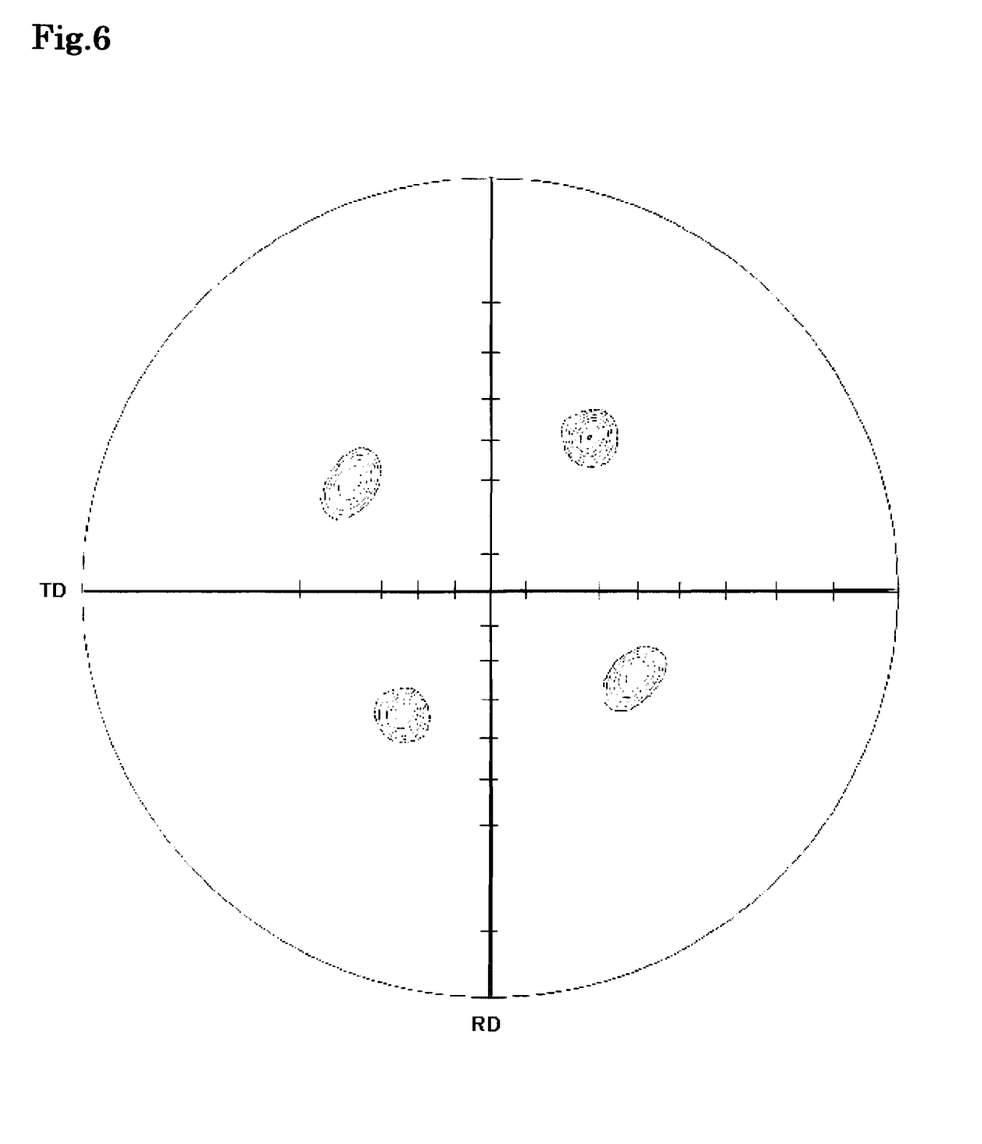
FIG. 6 is a (103) pole figure of a superconducting film (YBCO film) formed on a substrate of Sample 2 according to a third embodiment.

The superconducting film exfoliates due to the oxidation of the substrate caused by the diffusion of oxygen from the superconducting film, and from the above described result, it is understood that the oxidation of the substrate can be inhibited and a consequent exfoliation of the thin film can be prevented by using an appropriate intermediate layer. The orientation of the superconducting film on a sample which did not cause exfoliation was evaluated, and as a result, it was confirmed that the superconducting film has adequate orientation. FIG. 6 illustrates a (103) pole figure of the YBCO film in Sample 2.

What is claimed is:

1. A method for manufacturing a clad textured metal substrate for forming an epitaxial thin film thereon comprising the following steps:

(a) an orienting heat treatment step of cold-working a copper sheet at a working rate of 95% or more, and heat-treating the copper sheet obtained through the cold working in a non-oxidative atmosphere to make at least the surface part a {100}<001>cube texture having a deviating angle $\Delta\phi$ of crystal axes satisfying $\Delta\phi \leq 6$ degrees;

(b) a step of preparing a metal sheet; and (c) a surface activated bonding step of dry-etching the surfaces to be bonded of the copper sheet obtained by the orienting heat treatment step and the metal sheet in a non-oxidation atmosphere to remove the oxide and adsorbate on the surfaces to be bonded, and bonding the copper sheet with the metal sheet without or through the application of pressure.

2. The method for manufacturing the clad textured metal substrate for forming the epitaxial thin film thereon according to claim 1, wherein the temperature of orienting heat treatment in the step (a) is 200° C. or higher but a melting point of copper or lower.

3. The method for manufacturing the clad textured metal substrate for forming the epitaxial thin film thereon according to claim 2, wherein the dry-etching method in the surface activated bonding step of the step (c) is any of an ion beam etching method, an atom beam etching method, or a plasma etching method.

4. The method for manufacturing the clad textured metal substrate for forming the epitaxial thin film thereon according to claim 3, further comprising the step of polishing at least the surface of the copper sheet after having been subjected to orienting heat treatment to control the surface roughness Ra to 10 nm or less.

5. The method for manufacturing the clad textured metal substrate for forming the epitaxial thin film thereon according to claim 2, wherein a pressurizing force applied when bonding the copper sheet and the metal sheet after having been dry-etched, in the surface activated bonding step of the step (c) is in a range of 0.01 to 300 MPa.

6. The method for manufacturing the clad textured metal substrate for forming the epitaxial thin film thereon according to claim 5, further comprising the step of polishing at least the surface of the copper sheet after having been subjected to orienting heat treatment to control the surface roughness Ra to 10 nm or less.

7. The method for manufacturing the clad textured metal substrate for forming the epitaxial thin film thereon according to claim 2, further comprising the step of polishing at least the surface of the copper sheet after having been subjected to orienting heat treatment to control the surface roughness Ra to 10 nm or less.

8. The method for manufacturing the clad textured metal substrate for forming the epitaxial thin film thereon according to claim 2, further comprising the step of forming an intermediate layer on the surface of the copper layer, which comprises at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium and platinum.

9. The method for manufacturing the clad textured metal substrate for forming the epitaxial thin film thereon according to claim 1, wherein the dry-etching method in the surface activated bonding step of the step (c) is any of an ion beam etching method, an atom beam etching method, or a plasma etching method.

10. The method for manufacturing the clad textured metal substrate for forming the epitaxial thin film thereon according to claim 9, wherein a pressurizing force applied when bonding the copper sheet and the metal sheet after having been dry-etched, in the surface activated bonding step of the step (c) is in a range of 0.01 to 300 MPa.

11. The method for manufacturing the clad textured metal substrate for forming the epitaxial thin film thereon according to claim 10, further comprising the step of polishing at least the surface of the copper sheet after having been subjected to orienting heat treatment to control the surface roughness Ra to 10 nm or less.

12. The method for manufacturing the clad textured metal substrate for forming the epitaxial thin film thereon according to claim 9, further comprising the step of polishing at least the surface of the copper sheet after having been subjected to orienting heat treatment to control the surface roughness Ra to 10 nm or less.

13. The method for manufacturing the clad textured metal substrate for forming the epitaxial thin film thereon according to claim 9, further comprising the step of forming an intermediate layer on the surface of the copper layer, which comprises at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium and platinum.

14. The method for manufacturing the clad textured metal substrate for forming the epitaxial thin film thereon according to claim 1, wherein a pressurizing force applied when bonding the copper sheet and the metal sheet after having been dry-etched, in the surface activated bonding step of the step (c) is in a range of 0.01 to 300 MPa.

15. The method for manufacturing the clad textured metal substrate for forming the epitaxial thin film thereon according to claim 14, further comprising the step of polishing at least the surface of the copper sheet after having been subjected to orienting heat treatment to control the surface roughness Ra to 10 nm or less.

16. The method for manufacturing the clad textured metal substrate for forming the epitaxial thin film thereon according to claim 14, further comprising the step of forming an intermediate layer on the surface of the copper layer, which comprises at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium and platinum.

17. The method for manufacturing the clad textured metal substrate for forming the epitaxial thin film thereon according to claim 1, further comprising the step of polishing at least the surface of the copper sheet after having been subjected to orienting heat treatment to control the surface roughness Ra to 10 nm or less.

18. The method for manufacturing the clad textured metal substrate for forming the epitaxial thin film thereon according to claim 1, further comprising the step of forming an intermediate layer on the surface of the copper layer, which comprises at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium and platinum.

19. The method for manufacturing the clad textured metal substrate for forming the epitaxial thin film thereon according to claim 18, wherein the intermediate layer is formed by at least any of a pulse laser deposition method, a chemical vapor deposition method, a sputtering method, a vacuum deposition method, an ion plating method, an ion beam vapor deposition method, a spin coating method, a molecular beam epitaxy method and a plating method.

20. The method according to claim 1 wherein the metallic layer and the copper layer form an approximately flat bonded interface of which the waviness is in a range of 1 to 500 nm, wherein an intermediate layer is present on the surface of the copper, so as to form the epitaxial thin film thereon, wherein the intermediate layer is provided with at least one layer of a material selected from the group consisting of nickel, nickel oxide, zirconium oxide, rare-earth oxide, magnesium oxide, strontium titanate (STO), strontium barium titanate (SBTO), titanium nitride, silver, palladium, gold, iridium, ruthenium, rhodium, and platinum, and wherein the intermediate layer has a thickness in the range of 10 nm to 10 μm.

* * * * *